(12) United States Patent
Deng et al.

(10) Patent No.: US 12,426,177 B2
(45) Date of Patent: Sep. 23, 2025

(54) BUFFER MODULE AND ELECTRONIC DEVICE USING THE SAME

(71) Applicant: Pegatron Corporation, Taipei (TW)

(72) Inventors: Cun-Hong Deng, Taipei (TW); Ming-Te Lin, Taipei (TW); Chi-Ming Tsai, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 385 days.

(21) Appl. No.: 18/063,121

(22) Filed: Dec. 8, 2022

(65) Prior Publication Data
US 2023/0240025 A1 Jul. 27, 2023

(30) Foreign Application Priority Data
Jan. 22, 2022 (TW) ................................. 111102762

(51) Int. Cl.
| | |
|---|---|
| *H05K 5/02* | (2006.01) |
| *F16F 15/02* | (2006.01) |
| *F16F 15/04* | (2006.01) |
| *F16F 15/067* | (2006.01) |
| *G06F 1/16* | (2006.01) |
| *H05K 7/14* | (2006.01) |

(52) U.S. Cl.
CPC ............ *H05K 5/0217* (2013.01); *F16F 15/02* (2013.01); *F16F 15/04* (2013.01); *F16F 15/067* (2013.01); *H05K 7/142* (2013.01); *H05K 7/1427* (2013.01); *G06F 1/1656* (2013.01)

(58) Field of Classification Search
CPC .... H05K 5/0217; H05K 7/142; H05K 7/1427; F16F 15/02; F16F 15/04; F16F 15/067; G06F 1/1656
See application file for complete search history.

(56) References Cited

U.S. PATENT DOCUMENTS

| | | | | |
|---|---|---|---|---|
| 3,465,803 A | * | 9/1969 | Swanstrom | ........... F16B 41/002 |
| | | | | 411/968 |
| 3,814,357 A | * | 6/1974 | Rontgen | ................. F16F 1/128 |
| | | | | 248/573 |
| 6,140,591 A | * | 10/2000 | Osborne | ................ H05K 7/142 |
| | | | | 174/138 E |
| 6,252,768 B1 | * | 6/2001 | Lin | ....................... G06F 1/1656 |
| | | | | 361/679.55 |

(Continued)

FOREIGN PATENT DOCUMENTS

| | | |
|---|---|---|
| CN | 201797680 U | 4/2011 |
| CN | 211117354 U | 7/2020 |

(Continued)

OTHER PUBLICATIONS

TW office action dated Oct. 20, 2022 in TW application No. 111102762.

*Primary Examiner* — Rockshana D Chowdhury
*Assistant Examiner* — Martin Antonio Asmat Uceda
(74) *Attorney, Agent, or Firm* — McClure, Qualey & Rodack, LLP

(57) ABSTRACT

A buffer module including a base, a buffer element and an elastic element is provided. The base has a groove. The buffer element includes a spherical body movably disposed in the groove. The elastic element is disposed between a bottom surface of the groove and the spherical body.

18 Claims, 4 Drawing Sheets

(56) References Cited

U.S. PATENT DOCUMENTS

| | | | | |
|---|---|---|---|---|
| 6,307,748 B1 * | 10/2001 | Lin | ............ | H01L 23/4093 24/453 |
| 6,786,691 B2 * | 9/2004 | Alden, III | ............ | F16B 41/002 411/352 |
| 7,028,389 B2 * | 4/2006 | Chang | ............ | H05K 7/142 174/544 |
| 7,090,521 B2 * | 8/2006 | Nishio | ............ | H01R 13/6315 439/248 |
| 7,283,368 B2 * | 10/2007 | Wung | ............ | H01L 23/4093 165/185 |
| 7,701,699 B2 * | 4/2010 | Ma | ............ | G06F 1/1601 361/679.21 |
| 7,965,496 B2 * | 6/2011 | Li | ............ | G06F 1/184 361/679.01 |
| 8,480,039 B2 * | 7/2013 | Chang | ............ | G11B 33/124 361/679.33 |
| 8,779,295 B2 * | 7/2014 | Hsieh | ............ | H01R 12/714 361/740 |
| 8,807,271 B2 * | 8/2014 | Chen | ............ | H04R 1/2896 381/388 |
| 8,857,560 B1 * | 10/2014 | Liao | ............ | G10K 11/002 248/634 |
| 9,212,512 B2 * | 12/2015 | Nakasone | ............ | F16F 1/12 |
| 9,476,478 B2 * | 10/2016 | Staton | ............ | F16F 15/005 |
| 2003/0058627 A1 * | 3/2003 | Paquin | ............ | H05K 7/142 361/758 |
| 2006/0023416 A1 * | 2/2006 | Chen | ............ | G06F 1/1613 |
| 2009/0009955 A1 * | 1/2009 | Motoe | ............ | G06F 1/187 361/679.33 |
| 2010/0213649 A1 * | 8/2010 | Lee | ............ | G06F 1/183 29/592.1 |
| 2019/0220065 A1 * | 7/2019 | Lancaster-Larocque | ............ | G06F 1/1656 |
| 2020/0223558 A1 * | 7/2020 | Feng | ............ | B64C 27/001 |

FOREIGN PATENT DOCUMENTS

| | | | | |
|---|---|---|---|---|
| CN | 212718870 U | * | 3/2021 | ............ F16M 11/04 |
| JP | S49120083 A | * | 11/1974 | |
| TW | 501860 U | | 9/2002 | |
| TW | 201300661 A | | 1/2013 | |
| WO | 2014024353 A1 | | 2/2014 | |

* cited by examiner

BUFFER MODULE AND ELECTRONIC DEVICE USING THE SAME

This application claims the benefit of Taiwan application Serial No. 111102762, filed Jan. 22, 2022, the subject matter of which is incorporated herein by reference.

BACKGROUND

Technical Field

The disclosure relates in general to a buffer module and an electronic device using the same.

Description of the Related Art

An electronic device includes a number of electronic elements and a circuit board. Normally, the electronic elements are soldered on the circuit board. However, when the electronic device is applied by an impact force (for example, the electronic device drops) during use or is subject to a drop test, the electronic device will be applied by an external force, which may cause bending or deformation to the circuit board and make the solder on the circuit board cracked. When the solder cracks, the electronic elements of the electronic device may generate poor contact or may even come off the electronic device.

SUMMARY

The disclosure is directed to a buffer module and an electronic device using the same capable of resolving the above problems.

According to one embodiment of the present disclosure, a buffer module is provided. The buffer module includes a base, a buffer element and an elastic element. The base has a groove. The buffer element includes a spherical body movably disposed in the groove. The elastic element is disposed between a bottom surface of the groove and the spherical body.

According to another embodiment of the present disclosure, an electronic device is provided. The electronic device includes a casing, a circuit board and a buffer module. The buffer module connects the casing between the circuit board. The buffer module includes a base, a buffer element and an elastic element. The base has a groove. The buffer element includes a spherical body movably disposed in the groove. The elastic element is disposed between a bottom surface of the groove and the spherical body.

Based on the embodiments of the present disclosure, a buffer module and an electronic device using the same are provided. The spherical body of the buffer element is movably disposed relative to the base to provide a buffer stroke. During the buffer stroke, the elastic element may absorb an external force and reduce the damage caused to the electronic device by the external force.

The above and other aspects of the disclosure will become better understood with regard to the following detailed description of the preferred but non-limiting embodiment(s). The following description is made with reference to the accompanying drawings.

DESCRIPTION OF THE EMBODIMENTS

Figure 1:
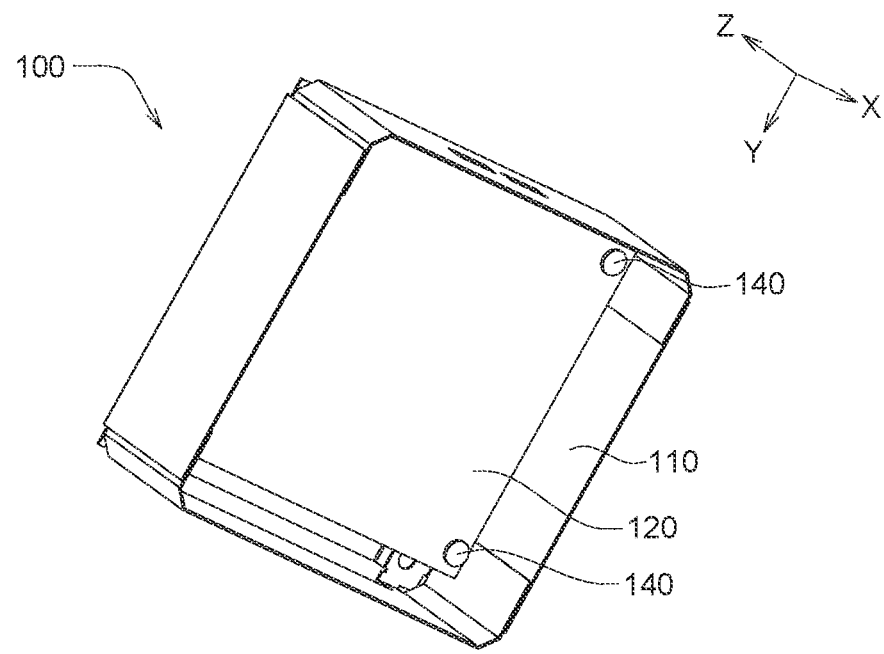
FIGS. 1 and 2 are schematic diagrams of an electronic device at different view angles according to an embodiment of the present disclosure.
Figure 2:
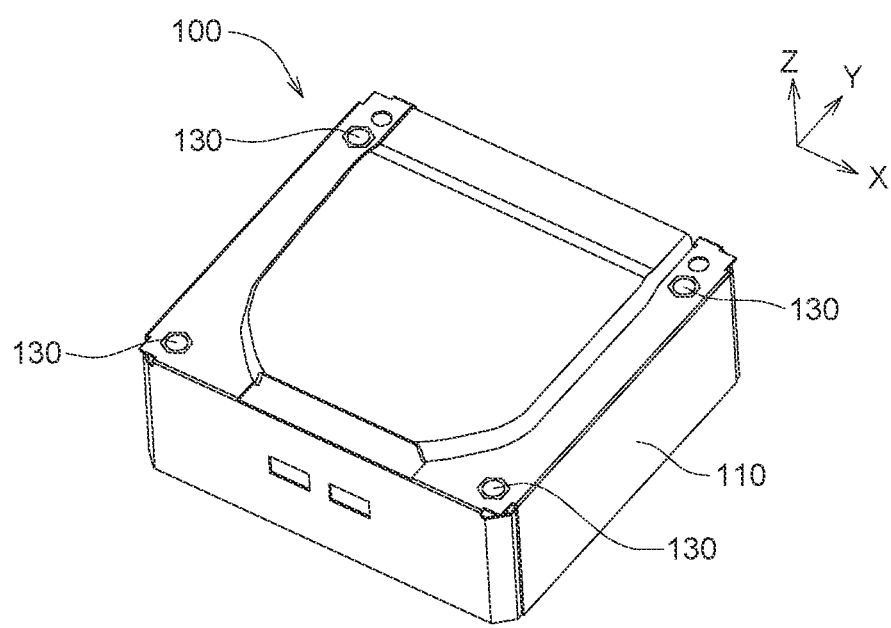
Figure 3:
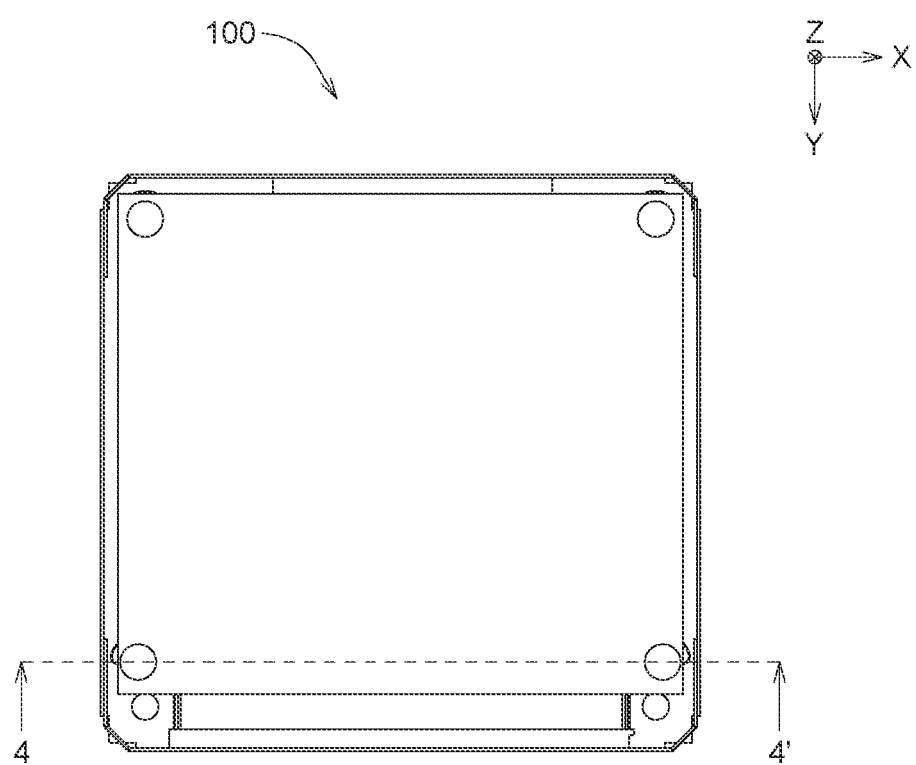
FIG. 3 is a top view of the electronic device of FIG. 1.
Figure 4:
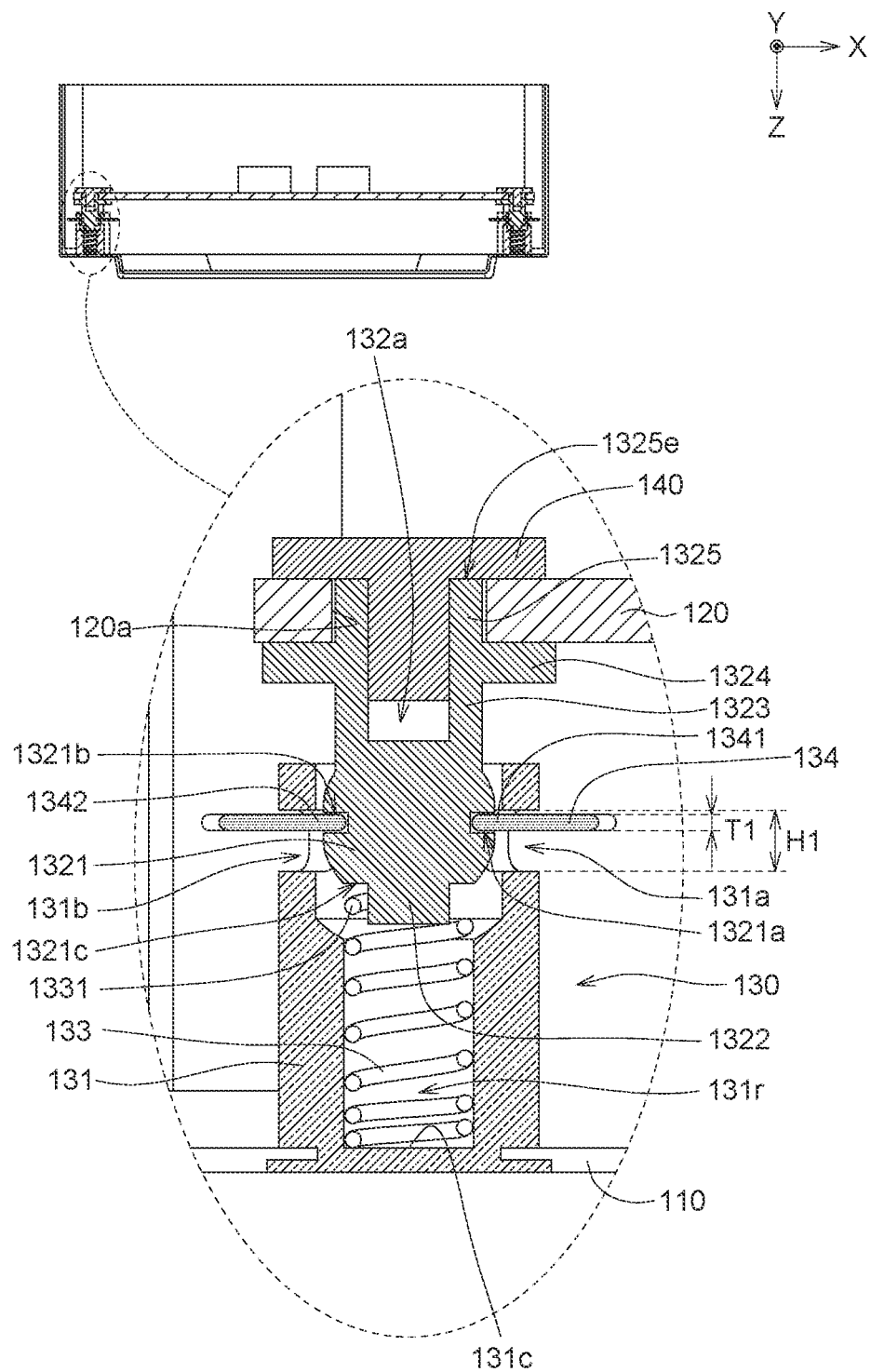
FIG. 4 is a cross-sectional view of the electronic device of FIG. 3 along direction 4-4'.
Figure 5:
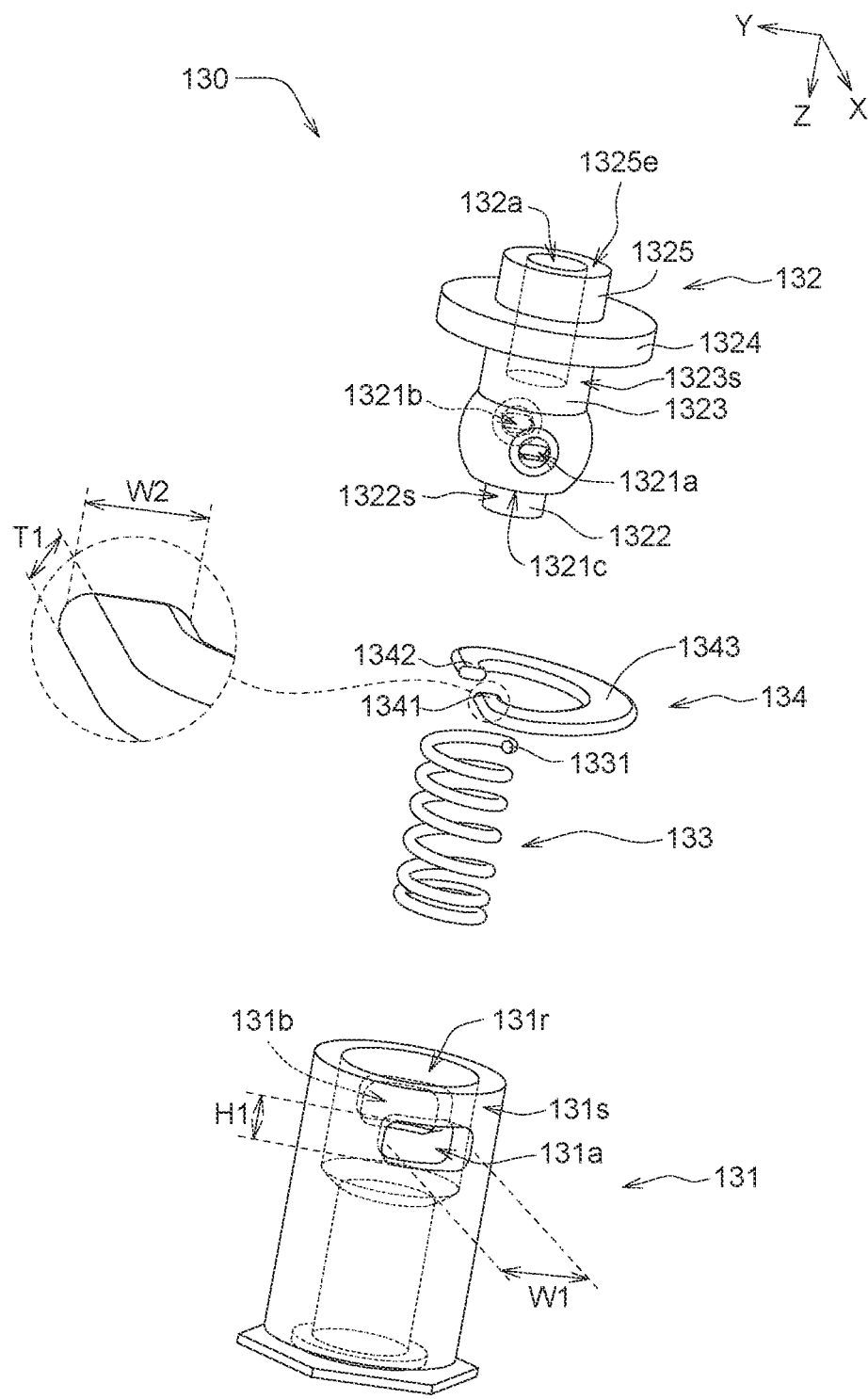
FIG. 5 is an explosion diagram of the buffer module of FIG. 2.

Referring to FIGS. 1 to 5, FIGS. 1 and 2 are schematic diagrams of an electronic device 100 at different view angles according to an embodiment of the present disclosure, FIG. 3 is a top view of the electronic device 100 of FIG. 1, FIG. 4 is a cross-sectional view of the electronic device 100 of FIG. 3 along direction 4-4', and FIG. 5 is an explosion diagram of the buffer module 130 of FIG. 2.

As indicated in FIGS. 1 to 2, the electronic device 100 includes a casing 110, a circuit board 120 and at least one buffer module 130. The buffer module 130 is connected to the casing 110 and the circuit board 120. For example, when the electronic device 100 is applied by an external force (for example, collision), the buffer module 130 may absorb the external force to reduce the damage caused to the electronic device 100 by the external force.

As indicated in FIG. 3, the number of buffer module 130 may be four and the four buffer modules 130 may respectively be disposed adjacent to four corners of the casing 110 of the electronic device 100. However, the present disclosure is not limited to the above exemplification, and the number of the buffer modules may depend on the size of the circuit board 120. As indicated in FIG. 4, the electronic device 100 further includes at least one fixing element 140, the circuit board 120 includes at least one via hole 120a, and each fixing element 140 may pass through the corresponding via hole 120a of the circuit board 120 to be fixed in the buffer module 130 for interconnecting the buffer module 130 with the circuit board 120.

As indicated in FIGS. 4 and 5, the buffer module 130 includes a base 131, a buffer element 132 and an elastic element 133. The base 131 has a groove 131r. The buffer element 132 includes a spherical body 1321 movably disposed in the groove 131r. The elastic element 133 is disposed between a bottom surface 131c of the groove 131r and the spherical body 1321. The spherical body 1321 is movably disposed relative to the base 131 to provide a buffer stroke. In the buffer stroke, the elastic element 133 may absorb the external force and reduce the damage caused to the electronic device 100 by the external force. In addition, the elastic element 133 may guide the spherical body 1321 moved due to the buffer stroke to return to the initial position.

As indicated in FIG. 4, there is a gap formed between the spherical body 1321 and the groove 131r of the base 131, so that the spherical body 1321 may rotate and/or deflect relative to the base 131.

As indicated in FIGS. 4 and 5, the base 131 further includes at least one through hole, such as a first through hole 131a and a second through hole 131b. The buffer module 130 further includes a limiting element 134 connected to the spherical body 1321 and partly located in the first through hole 131a. In the present embodiment, the first through hole 131a and the second through hole 131b are oppositely disposed. The limiting element 134 has a first terminal portion 1341 and a second terminal portion 1342. The first terminal portion 1341 and the second terminal portion 1342 are oppositely disposed. The first terminal portion 1341 passes through the first through hole 131a, and the second terminal portion 1342 passes through the second through hole 131b. In the present embodiment, the limiting element 134 may be realized by an annular body with an opening, such as a C-shaped ring, and further has a surrounding portion 1343. The first terminal portion 1341 and the second terminal portion 1342 are connected to the surrounding portion 1343. In an embodiment, the surrounding portion 1343, the first terminal portion 1341 and the second terminal portion 1342 may be integrally formed in one piece, but the embodiments of the present disclosure are not limited thereto. When the limiting element 134 is connected to the base 131, the surrounding portion 1343 surrounds a part of an outer peripheral surface 131s of the base 131.

As indicated in FIGS. 4 and 5, the spherical body 1321 has a first recessed hole 1321a and a second recessed hole 1321b, wherein the first recessed hole 1321a and the second recessed hole 1321b are oppositely disposed. The first terminal portion 1341 and the second terminal portion 1342 of the limiting element 134 respectively are disposed in the first recessed hole 1321a and the second recessed hole 1321b, so that the limiting element 134 may be connected to the spherical body 1321. In addition, the first through hole 131a and the first recessed hole 1321a are opposite along direction X. As a result, the first terminal portion 1341 of the limiting element 134 may be disposed in the first recessed hole 1321a through the first through hole 131a. Similarly, the second through hole 131b and the second recessed hole 1321b are opposite along direction X. As a result, the second terminal portion 1342 of the limiting element 134 may be disposed in the second recessed hole 1321b through the second through hole 131b. In the diagrams, directions X, Y and Z are perpendicular to each other.

As indicated in FIGS. 4 and 5, the first terminal portion 1341 and the second terminal portion 1342 of the limiting element 134 may be interfered within (such as engaged with) the first through hole 131a and the second through hole 131b respectively or may be loosely disposed or transitionally fitted in the first through hole 131a and the second through hole 131b. In addition, the first through hole 131a and the groove 131r are interconnected, so that the first terminal portion 1341 of the limiting element 134 may pass through the first through hole 131a to enter the groove 131r for being connected to the first recessed hole 1321a. Similarly, the second through hole 131b and the groove 131r are interconnected, so that the second terminal portion 1342 of the limiting element 134 may pass through the second through hole 131b to enter the groove 131r for being connected to the second recessed hole 1321b.

As indicated in FIG. 4, the limiting element 134 is movable relative to the first through hole 131a and the second through hole 131b, so that the buffer module 130 may provide the buffer stroke in at least one direction. In the present embodiment, the buffer module 130 may provide the buffer strokes in at least two directions. The above arrangements are exemplified below.

Take the first through hole 131a for example. As indicated in FIG. 4, the first through hole 131a has a height H1 along the first buffer direction Z, and the first terminal portion 1341 of the limiting element 134 has a thickness T1 along the first buffer direction Z, wherein the height H1 is greater than the thickness T1, so that the limiting element 134 may be movable along the first buffer direction Z. As a result, when the buffer module 130 is applied by the external force along the first buffer direction Z, the buffer element 132 may be displaced along the first buffer direction Z, so that the elastic element 133 may absorb the external force in the buffer stroke along the first buffer direction Z to avoid the external force over-damaging the elements of the electronic device 100, such as the circuit board 120 and/or other parts, and avoid the electronic elements disposed on the circuit board 120 coming off the circuit board 120.

As indicated in FIGS. 4 and 5, the first through hole 131a has a first width W1 along a second buffer direction Y. In other words, the first through hole 131a has the first width W1 along a circumferential direction of the base 131, and the first terminal portion 1341 of the limiting element 134 has a second width W2 along the second buffer direction Y (or along the circumferential direction), wherein the first width W1 is greater than the second width W2. As a result, when the buffer module 130 is applied by the external force along the second buffer direction Y, the buffer element 132 may be displaced along the second buffer direction Y. The elastic element 133 may absorb the external force or vibrational energy during the buffer stroke along the second buffer direction Y to avoid the external force or vibrational energy over-damaging the elements of the electronic device 100, such as the circuit board 120 and/or other parts, and avoid the electronic elements disposed on the circuit board 120 coming off the circuit board 120. Furthermore, there is the gap formed between a peripheral surface of the spherical body 1321 and the inner sidewall of the groove 131r along direction Y, so that the buffer element 132 may be displaced relative to the groove 131r along the second buffer direction Y.

As indicated in FIGS. 4 and 5, there is the gap formed between the peripheral surface of the spherical body 1321 and the inner sidewall of the groove 131r along direction X. As a result, when the buffer module 130 is applied by the external force along direction X, the buffer element 132 may be displaced along the direction X. The elastic element 133 may absorb the external force or vibrational energy during the buffer stroke along the direction X to avoid the external force or vibrational energy over-damaging the elements of the electronic device 100, such as the circuit board 120 and/or other parts, and avoid the electronic elements disposed on the circuit board 120 coming off the circuit board 120.

As indicated in FIGS. 4 and 5, the spherical body 1321 may rotate or deflect relative to the groove 131r around directions X, Y and Z because the spherical body 1321 is spherical, and there is a gap formed between the peripheral surface of the spherical body 1321 and the inner sidewall of the groove 131r, that is, the peripheral surface of the spherical body 1321 does not contact the inner sidewall of the groove 131r, and the spherical body 1321 is suspended in the groove 131r through the elastic element 133. When the spherical body 1321 rotates or deflects relative to the groove 131r, the elastic element 133 may absorb the external force or vibrational energy to avoid the external force or vibrational energy over-damaging the elements of the electronic device 100, such as the circuit board 120 and/or other parts, and avoid the electronic elements disposed on the circuit board 120 coming off the circuit board 120.

Based on the above disclosure, the spherical body 1321 has three degrees of freedom in translation and three degrees of freedom in rotation relative to the groove 131r, and these degrees of freedom cover all movements in the space.

As indicated in FIGS. 4 and 5, the elastic element 133 may be realized by a spring, for example, a compression spring, but the embodiments of the present disclosure are not limited thereto. The spherical body 1321 has a terminal surface 1321c, and the terminal surface 1321c may be separated from or in contact with the elastic element 133. As a result, when the buffer module 130a is applied by the external force or vibrational energy along the first buffer direction Z, the elastic element 133 may be immediately deformed to absorb the vibrational energy due to the spherical body 1321 contacting with the elastic element. Thus, the buffer module 130 has the shortest buffer response time. Furthermore, the elastic element 133 may be pre-compressed to create a predetermined deformation, so that the elastic element 133 may be applied by a pre-compression force. Alternatively, the elastic element 133 may touch the terminal surface 1321c lightly without pre-compression. Under such circumstances, the elastic element 133 is not applied by the pre-compression force. When the buffer module 130 is applied by the external force or vibrational energy along the first buffer direction Z, the buffer element 132 is displaced and drives the elastic element 133 to be displaced as well, so that the elastic element 133 may be deformed to store an elastic potential energy (absorbs the vibrational energy). Due to the elastic element 133 absorbing the vibrational energy, the electronic device 100 is prevented from being damaged or the damage caused to the electronic device 100 is reduced.

In addition, the relationships of size and connection between the second terminal portion 1342 of the limiting element 134 and the second through hole 131b may be similar to that between the first terminal portion 1341 and the first through hole 131a, and the similarities are not repeated here.

As indicated in FIGS. 4 and 5, the buffer element 132 further includes a first column 1322 connected to the spherical body 1321. For example, the first column 1322 is connected to the terminal surface 1321c of the spherical body 1321 and is protruded relative to the terminal surface 1321c. The terminal portion 1331 of the elastic element 133 surrounds the first column 1322. As a result, when the buffer element 132 deflects, for example, the buffer module 130 rotates around the first buffer direction Z, the first column 1322 may drive the elastic element 133 to be deformed to store an elastic potential energy (absorb the vibrational energy). In an embodiment, the inner peripheral surface of the terminal portion 1331 of the elastic element 133 may contact the outer peripheral surface 1322s of the first column 1322. When the buffer element 132a deflects, the elastic element 133 may be immediately deformed to absorb the vibrational energy due to the elastic element 133 contacting the first column 1322. In another embodiment, the terminal portion 1331 of the elastic element 133 may also be connected to the terminal surface 1321c of the spherical body 1321 and is adjacent to but does not contact the outer peripheral surface 1322s of the first column 1322.

As indicated in FIGS. 4 and 5, the buffer element 132 further includes a second column 1323 and a flange 1324. The flange 1324 is connected to the second column 1323 and is protruded relative to the outer peripheral surface 1323s of the second column 1323, so that the circuit board 120 may lean on the flange 1324 protruded outwards.

As indicated in FIGS. 4 and 5, the buffer element 132 further includes a third column 1325. The second column 1323 and the third column 1325 are connected to two opposite sides of the flange 1324 respectively, such as two opposite terminal surfaces of the flange 1324. The third column 1325 may pass through the via hole 120a of the circuit board 120 or may be located at the via hole 120a of the circuit board 120, wherein the circuit board 120 leans on the terminal surface of the flange 1324. The buffer element 132 has a fixing hole 132a extended in a direction from the terminal surface 1325e of the third column 1325 towards the spherical body 1321. For example, the fixing hole 132a may extend to the flange 1324, the second column 1323 or even the spherical body 1321. In an embodiment, the fixing hole 132a may be realized by a screw hole, and the fixing element 140 may be realized by a male thread element (such as screw). The fixing element 140 may be screwed in the fixing hole 132a to interconnect the circuit board 120 with the buffer module 130. In another embodiment, the fixing hole 132a may not have the inner thread, and the fixing element 140 may be engaged in the fixing hole 132a to press the circuit board 120 on the flange 1324 of the buffer module 130.

As disclosed above embodiments of the present disclosure, a buffer module connects a casing and a circuit board of an electronic device to absorb the impact generated on the electronic device by the external force, so that the damage caused to the electronic device may be reduced or even may be avoided. Also, the buffer module may provide a buffer stroke in at least one direction. As a result, even when the external force applying to the buffer module comes from different directions, the buffer module still may provide an excellent anti-vibration effect.

While the disclosure has been described by way of example and in terms of the preferred embodiment(s), it is to be understood that the disclosure is not limited thereto. Based on the technical features embodiments of the present disclosure, a person ordinarily skilled in the art will be able to make various modifications and similar arrangements and procedures without breaching the spirit and scope of protection of the disclosure. Therefore, the scope of protection of the present disclosure should be accorded with what is defined in the appended claims.

What is claimed is:

1. A buffer module, comprising:
   a base comprising a groove, a first through hole and a second through hole;
   a buffer element comprising a spherical body movably disposed in the groove;
   an elastic element disposed between a bottom surface of the groove and the spherical body; and
   a limiting element comprising a first terminal portion, a second terminal portion and a surrounding portion, the first terminal portion and the second terminal portion connected to the surrounding portion, wherein the first terminal portion and the second terminal portion pass through the first through hole and the second through hole of the base, respectively, to connect the spherical body, and the surrounding portion surrounds a part of an outer peripheral surface of the base.

2. The buffer module according to claim 1, wherein each of the first through hole and the second through hole has a height along a first buffer direction, each of the first terminal portion and the second terminal portion of the limiting element has a thickness along the first buffer direction, and the height is greater than the thickness.

3. The buffer module according to claim 1, wherein each of the first through hole and the second through hole has a first width along a second buffer direction, each of the first terminal portion and the second terminal portion of the limiting element has a second width along the second buffer direction, and the first width is greater than the second width.

4. The buffer module according to claim 1, wherein the spherical body has a first recessed hole and a second recessed hole, and the first terminal portion and the second terminal portion respectively are disposed in the first recessed hole and the second recessed hole.

5. The buffer module according to claim 1, wherein the buffer element further comprises a first column connected to the spherical body and surrounded by a terminal portion of the elastic element.

6. The buffer module according to claim 5, wherein the terminal portion of the elastic element contacts an outer peripheral surface of the first column.

7. The buffer module according to claim 1, wherein the buffer element further comprises a second column and a flange, and the flange is connected to the second column and protruded relative to an outer peripheral surface of the second column.

8. The buffer module according to claim 7, wherein the buffer element further comprises a third column, and the second column and the third column respectively are connected to opposite two sides of the flange.

9. The buffer module according to claim 1, wherein the spherical body has a terminal surface, and the terminal surface and the elastic element contact each other.

10. An electronic device, comprising:
a casing;
a circuit board; and
a buffer module connecting the casing and the circuit board, and comprising:
a base comprising a groove, a first through hole and a second through hole;
a buffer element comprising a spherical body movably disposed in the groove;
an elastic element disposed between a bottom surface of the groove and the spherical body; and
a limiting element comprising a first terminal portion, a second terminal portion and a surrounding portion, the first terminal portion and the second terminal portion connected to the surrounding portion, wherein the first terminal portion and the second terminal portion pass through the first through hole and the second through hole of the base, respectively, to connect the spherical body, and the surrounding portion surrounds a part of an outer peripheral surface of the base.

11. The electronic device according to claim 10, wherein each of first through hole and the second through hole has a height along a first buffer direction, each of the first terminal portion and the second terminal portion of the limiting element has a thickness along the first buffer direction, and the height is greater than the thickness.

12. The electronic device according to claim 10, wherein each of the first through hole and the second through hole has a first width along a second buffer direction, each of the first terminal portion and the second terminal portion of the limiting element has a second width along the second buffer direction, and the first width is greater than the second width.

13. The electronic device according to claim 10, wherein the spherical body has a first recessed hole and a second recessed hole, and the first terminal portion and the second terminal portion respectively are disposed in the first recessed hole and the second recessed hole.

14. The electronic device according to claim 10, wherein the buffer element further comprises a first column connected to the spherical body and surrounded by a terminal portion of the elastic element.

15. The electronic device according to claim 14, wherein the terminal portion of the elastic element contacts an outer peripheral surface of the first column.

16. The electronic device according to claim 10, wherein the buffer element further comprises a second column and a flange, and the flange is connected to the second column and protruded relative to an outer peripheral surface of the second column.

17. The electronic device according to claim 16, wherein the buffer element further comprises a third column, and the second column and the third column respectively are connected to opposite two sides of the flange.

18. The electronic device according to claim 10, wherein the spherical body has a terminal surface, and the terminal surface and the elastic element contact each other.

* * * * *